US006229360B1

(12) United States Patent
Mizuno et al.

(10) Patent No.: US 6,229,360 B1
(45) Date of Patent: May 8, 2001

(54) HIGH SPEED SYNCHRONIZATION CIRCUIT IN SEMICONDUCTOR INTEGRATED CIRCUIT

(75) Inventors: Masayuki Mizuno; Masakazu Yamashina, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/149,282

(22) Filed: Sep. 9, 1998

(30) Foreign Application Priority Data

Sep. 10, 1997 (JP) ........................................ 9-244892

(51) Int. Cl.[7] ........................................ H03K 5/04
(52) U.S. Cl. ........................................ 327/141; 327/199
(58) Field of Search ........................................ 326/98; 327/199, 327/200, 201, 202, 203, 208, 209, 210, 211, 212, 218, 225, 141

(56) References Cited

U.S. PATENT DOCUMENTS 5,162,667 * 11/1992 Yasui et al. .................... 327/203
5,742,190 * 4/1998 Banik et al. .................... 327/152
5,880,613 * 3/1999 Ishihara .................... 327/202

FOREIGN PATENT DOCUMENTS 59-161912 9/1984 (JP) .
6-109816 4/1994 (JP) .
6-152345 5/1994 (JP) .
7-249967 9/1995 (JP) .
8-17182 1/1996 (JP) .

OTHER PUBLICATIONS

H. Partovi et al., "Flow–Through Latch and Edge–Triggered Flip–Flop Hybrid Elements", ISSCC96/ Session 8/Digital Clocks and Latches/Paper FA8.5, 1996, 138–139.

* cited by examiner

*Primary Examiner*—Kenneth B. Wells
*Assistant Examiner*—Linh Nguyen
(74) *Attorney, Agent, or Firm*—Sughrue, Mion, Zinn, Macpeak & Seas, PLLC

(57) ABSTRACT

A first latching circuit transferring an input signal from the input terminal to the output terminal for a predetermined period in response to a level transition timing of one direction of a clock signal input to the clock terminal, and maintaining a signal condition of the output terminal in the remaining period, and a second latching circuit transferring an input signal from the input terminal to the output terminal for a predetermined period in response to a level transition timing of the other direction of the clock signal input to the clock terminal, and maintaining a signal condition of the output terminal in the remaining period, are provided. A desired logic circuit is connected between the first and second latching circuits. By synchronously operating the first and second latching circuits by supplying a common clock signal, a clock synchronization circuit not influenced by fluctuation of the device, fluctuation of temperature or power source can be formed.

9 Claims, 9 Drawing Sheets

HIGH SPEED SYNCHRONIZATION CIRCUIT IN SEMICONDUCTOR INTEGRATED CIRCUIT

BACKGROUND OF THE INVENTION

1. Field of the Invention

The present invention relates to a synchronization circuit. More particularly, the invention relates to a high speed synchronization circuit in a semiconductor integrated circuit.

2. Description of the Related Art

In a synchronization circuit operative in synchronism with a clock signal, a circuit design based on the clock signal and a D-type flip-flop (DFF) has been currently employed, frequently. There are some synchronization circuit, in which a plurality of circuit structures, each disposing a predetermined logic circuit between DFFs operative in synchronism with the clock signal, are connected in cascade connection. In such case, the DFF serves as a latching circuit which latches an input signal from the logic circuit in the preceding stage in synchronism with the clock signal and feeds the latch signal to the logic circuit in the later stage in synchronism with the clock. Supply of the clock signal to these DFFs is performed by supplying a common clock signal through a clock tree.

An example of a known structure of the DFF to be employed in the synchronization circuit of the type set forth above as the latching circuit is shown in FIG. 7. In FIG. 7, an input signal from an input terminal IN is lead to an output terminal OUT through a transfer gate 73, an inverter 74, a transfer gate 77 and an inverter 78 in sequential order . An output of the inverter 74 is fed back to an input of the inverter 74 via an inverter 75 and a transfer gate 76.

On the other hand, an output of the inverter 78 is fed back to an input of the inverter 78 via an inverter 79 and a transfer gate 80. A clock signal from a clock input terminal CLK performs ON/OFF control of respective transfer gates 73,76, 77 and 80.

In the DFF constructed as set forth above, considering a period, in which the input data should not vary before a rise-up timing of the clock signal, namely a set up period $T_{su}$, a period, in which the input data should not vary after rising up of the clock signal, namely a hold period $T_{hold}$, a period, in which an output data varies after rising up of the clock signal, namely a delay period $T_{pd}$, the following definition can be established with reference to FIG. 7.

The set up period $T_{su}$ is defined by a difference between a period required for closing the transfer gate 73 in response to variation of the clock signal and a period, in which an input signal of the input terminal IN varies and the signal reaches a node A6. The hold period $T_{hold}$ is defined by a period required for closing the transfer gate 73 in response to variation of the clock signal. The delay period $T_{pd}$ is defined a period, in which the transfer gate 77 is opened in response to variation of the clock signal and the signal of the node A4 is propagated to the output terminal OUT.

Now, a minimum value of an input/output delay period required in the logic circuit is considered. Namely, condition that when the clock signal is risen, the output data of the logic circuit receiving the input data upon rising of the immediately preceding clock signal, can be input to the logic circuit in the next stage, is considered. In other words, a condition that upon rising of the clock signal, the output data of the DFF simultaneously does not pass more than one logic circuits to be output data of other DFFs, is considered.

On the other hand, a maximum value of the input/output delay period required in the logic circuit is considered. Namely, a condition that, upon rising of the clock signal, the DFF outputs data, and the output of the DFF passes through the logic circuit to be an output data of the DFF upon rising of the next clock signal, is considered. The input/output delay period to the logic circuit employed in the synchronization circuit includes both of the minimum value and the maximum value.

Assuming that a period of the clock signal is $T_{cyc}$, the maximum value of the input/output delay period of the logic circuit disposed between the DFFs becomes a period subtracted the set up period $T_{su}$, the hold period $T_{hold}$, the delay period $T_{pd}$, a skew of the clock signal and its jitter from the clock period $T_{cyc}$. On the other hand, the minimum value of the input/output delay period of the logic circuit to be disposed between the DFFs is a period subtracted the delay period $T_{pd}$ from a sum of the hold period $T_{hold}$ and the skew of the clock signal.

For example, in case of a circuit produced by typical 0.35 μm CMOS process, the set up period $T_{su}$ is 150 ps, the hold period $T_{hold}$ is 150 ps, the delay period $T_{pd}$ is 200 ps, the skew of the clock signal is 150 ps and the jitter thereof is about 150 ps.

Now, when the period $T_{cyc}$ of the clock is assumed to be 10 ns (100 MHz), the maximum value of the input/output delay period of the logic circuit to be disposed between the DFFs becomes 9.2 ns, and similarly, the minimum value becomes 100 ps. Similarly, assuming that the period $T_{cyc}$ of the clock signal is 1 ns (1 GHz), the maximum value of the input/output delay period of the logic circuit to be disposed between the DFFs becomes 200 ps and, similarly, the minimum value becomes 100 ps.

In general, due to a fluctuation of the diffusion condition of the device, namely due to the fluctuation of the channel length or the oxide layer of the transistor, fluctuation of a temperature or a power source voltage, the input/output delay period of the logic circuit may fluctuate. For example, assuming that the minimum value is one, the maximum value is varied to be about two.

Namely, when the period of the clock signal is assumed to be 1 ns (1 GHz), it becomes quite difficult to set the input/output delay period of the logic circuit between 100 ps to 200 ps. For setting the input/output delay period of the logic circuit between 100 ps to 200 ps, it becomes necessary to use less fluctuation of the diffusion condition of the device by lowering yield in manufacturing and to use temperature control or high precision power source so as not to cause fluctuation of the temperature or the power source voltage, to be a factor of cost-up.

On the other hand, due to timing error of the clock supplied to individual DFF within LSI due to increasing of number of elements or increasing of area of the LSI, the skew of the clock is inherently increased. When the skew of the clock is caused, it becomes difficult to satisfy the hold period of the DFF to cause a necessity to add large number of delay elements between the DFFs to design the circuit for avoiding a signal path having a delay period less than a predetermined minimum delay period. In this case, number of delay elements of the overall LSI becomes huge to cause increasing of the chip area and increasing of power consumption. On the other hand, when the delay element is not added, malfunction of the LSI can be caused.

As a method for solving the foregoing problem, there is a method disclosed in Japanese Unexamined Patent Publication No. Heisei 7-249967, for example. FIG. 8 shows a construction disclosed in the above-identified publication. In FIG. 8, the input signal of the input terminal IN is lead from the output terminal OUT through a transfer gate 88, an inverter 89, a transfer gate 90, an inverter 91, an inverter 92, a transfer gate 94 and an inverter 95 in sequential order. On the other hand, an output of the inverter 92 is fed back to an input to the inverter 91 via a transfer gate 93.

The clock signal CLK is delayed for a given period by an inverter 81 and buffers 82 and 83 and becomes one input of an NAND gate 84. To the other input of the NAND gate 84, the clock signal is directly supplied. The output of the NAND gate 84 is used for ON/OFF control of the transfer gates 88, 90, 93 and 94 via the inverters 85, 86 and 87.

At rising of a pulse signal generated at a node B3 upon rising of the clock signal, an input data is taken from the input terminal IN. At falling down of the pulse signal, the taken input data is lead to the output terminal OUT.

The set up period $T_{su}$ of this circuit is defined by a difference between a period of closing of the transfer gate 88 in response to the clock signal and a period, in which an input signal of the input terminal IN varies and the signal reachs a node B1. The hold period $T_{hold}$ is defined by a period to close the transfer gate 88 in response to variation of the clock signal. The delay period $T_{pd}$ is defined to a period to propagate a signal of a node B2 by opening the transfer gate 94 in response to variation of the clock signal, to the output terminal OUT.

Next, similarly to the prior art shown in FIG. 7, the minimum value and the maximum value of the input/output period of the logic circuit is derived. The maximum value of the input/output delay period of the logic circuit becomes period subtracted the set up period $T_{su}$, the hold period $T_{hold}$, the delay period $T_{pd}$, a width $T_{pw}$ of a pulse B3, the skew of the clock and the jitter thereof from the clock period $T_{cyc}$. On the other hand, the minimum value becomes a period subtracted the delay period $T_{pd}$ from the hold period $T_{hold}$ by setting the pulse width $T_{pw}$ greater than the clock skew.

Namely, in the synchronization circuit employing the prior art shown in FIG. 8, malfunction of the LSI due to clock skew caused by timing error of clock distribution or so forth can be avoided.

However, it is still not possible to make the minimum value of the input/output delay period required to the logic circuit zero. On the other hand, even if the pulse width $T_{pw}$ and the clock skew are the same, the maximum value of the input/output delay period of the logic circuit cannot be made smaller than the circuit using the prior art shown in FIG. 7.

On the other hand, as a further prior art, there is a synchronization circuit constructed as shown in FIG. 9. This prior are has been disclosed in 1996, IEEE, International Solid State Circuits Digest of Technical Papers, pp 138 to 139.

Referring to FIG. 9, an input signal from the input terminal IN is supplied to respective gates of an NMOS transistor (hereinafter simply referred to with omitting transistor) 101 and a PMOS 103. Between power sources, PMOS 99, NMOSs 100, 101 and 102 are connected in series in sequential order. The PMOS 103 is disposed between a drain of the NMOS 100 and a reference potential. On the other hand, a PMOS 105 and NMOSs 106 to 108 are connected between the power sources in series in sequential order. Also, a PMOS 104 is connected between a gate of the PMOS 105 and the reference potential. The gate of the PMOS 105 and the drain of the NMOS 100 are connected in common.

To a drain of the NMOS 106, a pair of inverters 109 and 110 are provided in positive feedback structure to operate as an output amplifier. An output of the output amplifier serves as the output terminal OUT.

The clock signal CLK is directly supplied to respective gates of the PMOS 99 and NMOSs 100 and 106. On the other hand, the clock signal CLK is supplied to gates of the NMOS 102, PMOS 104 and NMOS 108 via a series circuit of the inverters 96 to 98.

In this circuit, the data on the input terminal IN is lead to the output terminal OUT as is for a period (pulse width $T_{pw}$) propagating the clock signal of a node IT1 from a timing of rising of the clock signal. In other period, the signal level of the output terminal OUT is maintained.

A period where the input data should not vary before rising timing of the clock signal, namely the set up period $T_{su}$ is set to zero, a period, in which the input data should not vary after rising up of the clock signal, namely a hold period $T_{hold}$ is zero and a period, in which an output data varies after rising up of the clock signal, namely a delay period $T_{pd}$ is defined by a period to propagate the signal of a node IT2 to the output terminal OUT in response to variation of the clock CLK.

Next, similarly to the former prior art, the maximum value and the minimum value of the input/output delay period of the logic circuit is derived. The maximum value becomes a value subtracted the delay period $T_{pd}$ from the period $Y_{cyc}$ of the clock signal. However, the minimum value of the input/output delay period required to the logic circuit becomes a period subtracted the delay period from a sum of the pulse width $T_{pw}$ of the pulse signal and the skew of the clock signal.

Namely, in the prior art employing the third circuit, the maximum value of the input/output delay period of the logic circuit can be set so as not to be influenced by the clock skew, jitter, the set up period present in the first and second prior art or the hold period. However, malfunction of the LSI due to clock skew caused by timing error of the clock distribution or so forth, cannot be prevented. On the other hand, as set out in the first prior art, delay element becomes necessary for preventing malfunction to make it difficult to increase power consumption and to cause difficulty in designing and verification of operation in the high speed circuit.

As set forth above, as a construction where the circuits provided with the desired logic circuit between the DFFs are connected in cascade connection, in the synchronization circuit operative in synchronism with the clock signal, influence of the skew of the clock signal and jitter thereof cannot be ignored. Also, the synchronization circuit should be influenced by fluctuation of the temperature or so forth during manufacturing of the device, fluctuation of the channel length or gate oxide layer, fluctuation of the temperature during operation or fluctuation of the power source voltage.

SUMMARY OF THE INVENTION

An object of the present invention is to provide a synchronization circuit operative in synchronism with a clock signal with avoiding influence of skew of the clock signal, jitter or so forth.

Another object of the present invention is to provide a synchronization circuit, in which a circuit operation is not influenced by fluctuation of channel length or fluctuation of gate oxide layer due to fluctuation of temperature or so forth during manufacturing of the device, and also by fluctuation of temperature during operation or fluctuation of power source voltage.

A further object of the present invention is to provide a synchronization circuit which can make a maximum value of an input/output delay period of a logic circuit disposed between registers controlling flow of data by a clock signal.

According to the first aspect of the present invention, a synchronization circuit comprises:

a first latching circuit having an input terminal, an output terminal and a clock terminal, transferring an input signal from the input terminal to the output terminal for a predetermined period in response to a level transition timing of one direction of a clock signal input to the clock terminal, and maintaining a signal condition of the output terminal in the remaining period;

a second latching circuit having an input terminal, an output terminal and a clock terminal, transferring an input signal from the input terminal to the output terminal for a predetermined period in response to a level transition timing of the other direction of the clock signal input to the clock terminal, and maintaining a signal condition of the output terminal in the remaining period; and a logic circuit connected between the first and second latching circuit, a common clock signal being supplied to the clock terminals of the first and second latching circuits.

According to the second aspect of the present invention, a synchronization circuit comprises:

a first latching circuit having an input terminal, an output terminal and a clock terminal, transferring an input signal from the input terminal to the output terminal for a predetermined period in response to a level transition timing of one direction of a clock signal input to the clock terminal, and maintaining a signal condition of the output terminal in the remaining period;

a second latching circuit having an input terminal, an output terminal and a clock terminal, transferring an input signal from the input terminal to the output terminal for a predetermined period in response to a level transition timing of the other direction of the clock signal input to the clock terminal, and maintaining a signal condition of the output terminal in the remaining period;

a first logic circuit connected between the first and second latching circuit;

a third latching circuit having the same construction as the first latching circuit; and a second logic circuit connected between the second latching circuit and the third latching circuit, a common clock signal being supplied to the clock terminals of the first to third latching circuits.

The operation of the present invention will be discussed. The synchronization circuit is constructed employing the latching circuit, in which pulse to be effective for the predetermined period in synchronism with a level transition timing, such as rising or falling of the clock signal is generated, and in the period where the pulse is effective, the input data is output to the output terminal. By this, the maximum value of the input/output delay period of the logic circuit can be set to avoid influence of the clock skew, jitter, the set up period or hold period.

On the other hand, in the construction set forth above, the synchronization circuit is constructed by inserting the logic circuit between the first latching circuit leading the input signal from the input terminal to the output terminal for a predetermined period in response to a level transition timing of one direction of a clock signal input to the clock terminal and the second latching circuit leading the input signal from the input terminal to the output terminal for a predetermined period in response to a level transition timing of the other direction of the clock signal input to the clock terminal, and maintaining a signal condition of the output terminal in the remaining period. Such circuit constructions are connected in cascade connection to form the synchronization circuit. By this, malfunction of the LSI due to clock skew can be avoided.

In the construction set forth above, assuming a period of a first level of the clock signal being Tch, a period of a second level being Tcl, and a period of sum of a skew and a jitter of the clock signal being Ts, in the first latching circuit, a minimum value of a period for transferring the input signal of the input terminal being the output terminal being Twh and a maximum value being k×Twh (k is an actual number greater than one), in the second latching circuit, a minimum value of a period for transferring the input signal of the input terminal to the output terminal being Twl and a maximum value being k×Twl, setting satisfying $$Ts<Twh<(Tch-Ts)/k$$

$$Ts<Twl<(Tch-Ts)/k$$

may be established. Thus, influence for the synchronization circuit due to fluctuation of the channel length, the gage oxide layer and so forth due to fluctuation of temperature or so forth during manufacturing of the device, fluctuation of temperature during operation, or fluctuation of the power source voltage, can be avoided.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
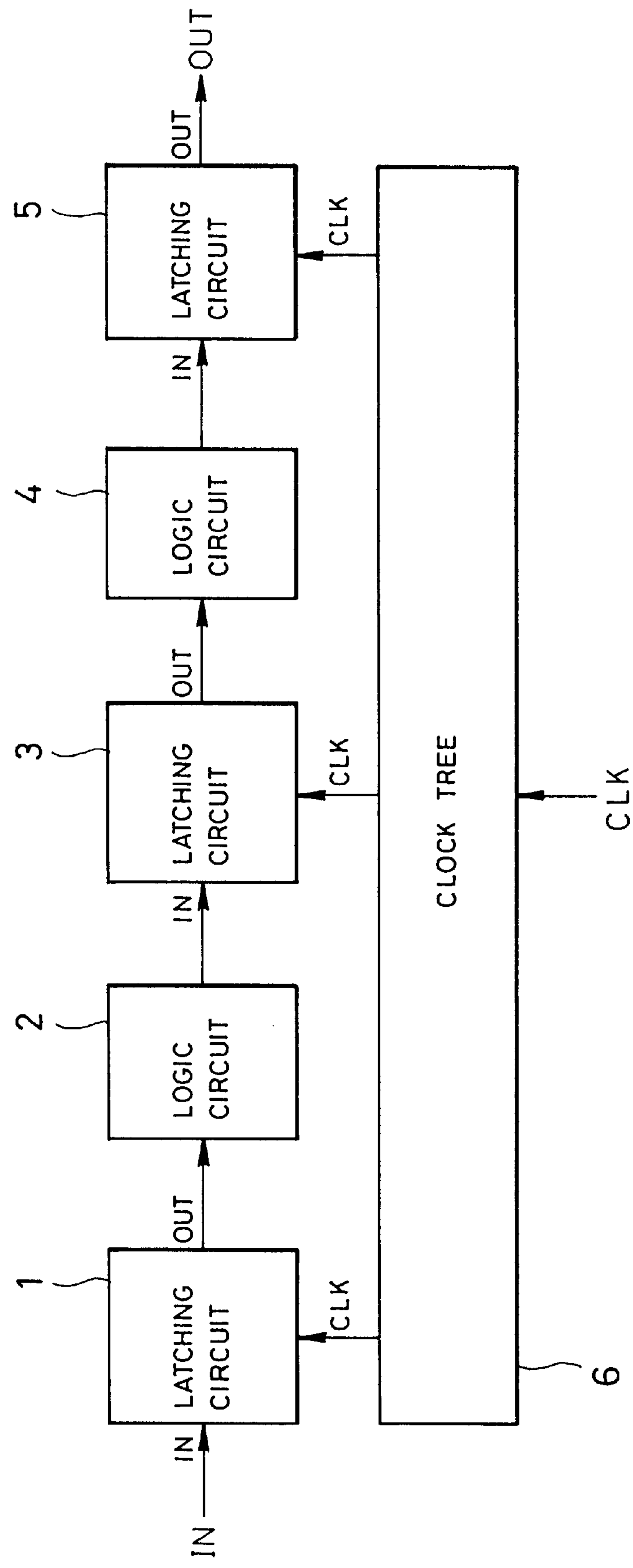
FIG. 1 is a block diagram of a preferred embodiment of a synchronization circuit according to the present invention.
Figure 2:
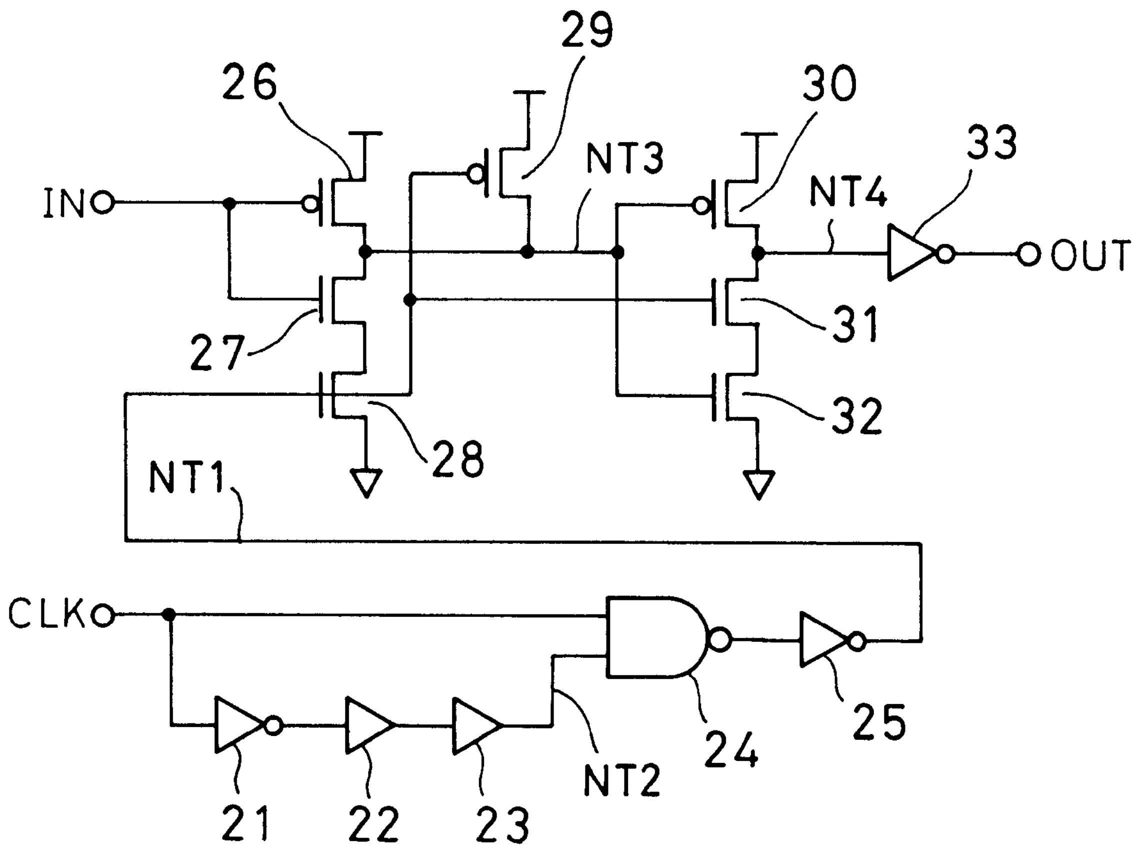
FIG. 2 is an illustration showing one embodiment of latching circuits 1 and 5 of the preferred embodiment of the synchronization circuit shown in FIG. 1.
Figure 3:
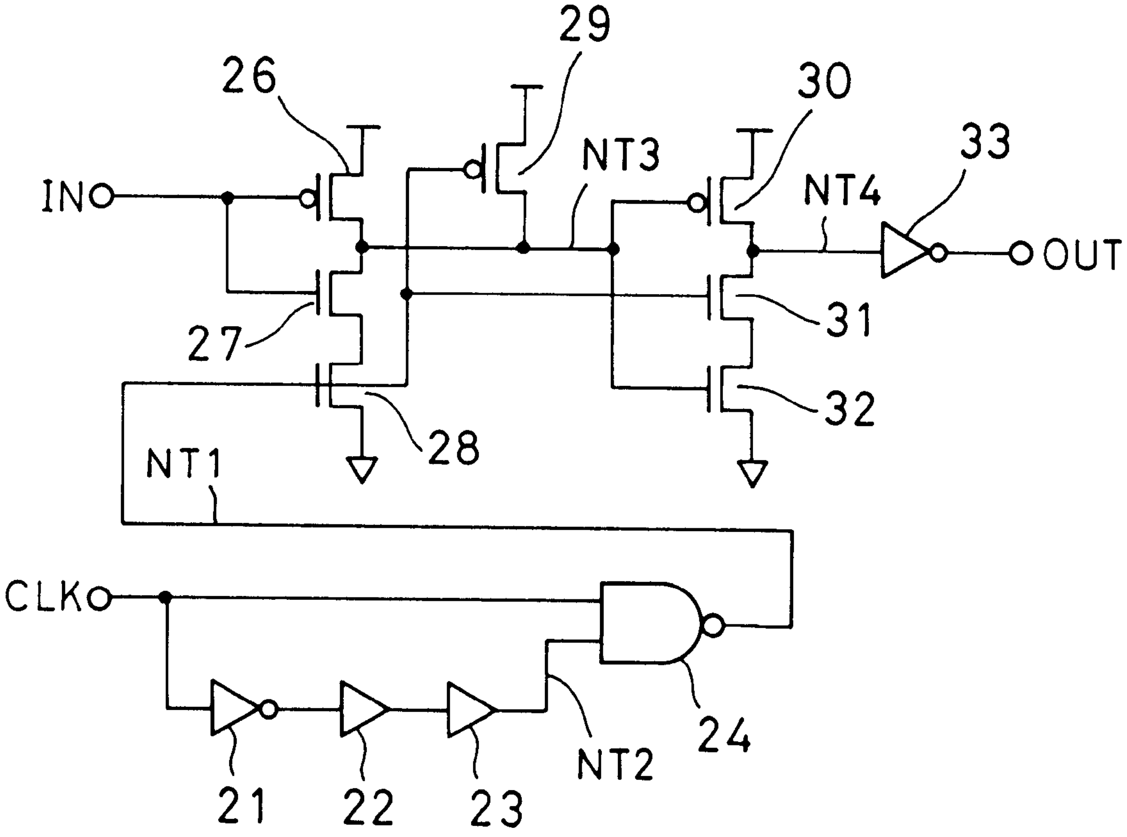
FIG. 3 is an illustration showing one embodiment of latching circuit 3 of the preferred embodiment of the synchronization circuit shown in FIG. 1.

FIG. 1 is an illustration showing the preferred embodiment of a synchronization circuit according to the present invention. Between a latching circuit 1 and a latching circuit 3, a predetermined logic circuit 2 is disposed. Also, between the latching circuit 3 and a latching circuit 5, a logic circuit 4 is disposed. In this case, the latching circuit 1 and the latching circuit 3 are different in circuit construction. The latching circuit 1 has a construction as illustrated in FIG. 2 and the latching circuit 3 has a construction as illustrated in FIG. 3. On the other hand, the latching circuit 5 is equivalent to the latching circuit 1 and thus has the construction illustrated in FIG. 2.

In the shown embodiment, between the latching circuits 1, 3 and 5, the logic circuits 2 and 4 are disposed. In short, a basic construction is that the logic circuit is disposed between two kinds of latching circuits. It is also possible to establish the synchronization circuit by connecting circuits having the foregoing basic construction by cascade connection. To these latching circuits, a common clock is supplied from a clock tree 6.

The latching circuits 1 and 5 detects a timing to rise up a clock signal CLK from low level to high level and transmits an input signal from an input terminal IN to an output terminal OUT for a predetermined period from the timing of detection of rising edge of the clock signal. The latching circuits 1 and 5 maintains the output signal in the remaining period.

The latching circuit 3 detects falling down of the clock signal CLK from high level to low level to transmit the input signal from the input terminal IN to the output terminal OUT for a predetermined period from the timing of detection of falling edge of the clock signal CLK. The latching circuit 3 maintains the output signal for the remaining period.

FIG. 2 is an illustration showing a construction of the latching circuits 1 and 5. An input data of the input terminal IN is input to an inverter circuit consisted of CMOSs 26 to 28. It should be noted that the CMOS 28 is controlled by a pulse on a node NT1. A CMOS inverter output is input to an inverter circuit of the next stage consisted of CMOSs 30 to 32. It should be noted that the CMOS 31 is controlled by a pulse of the node NT1.

The output of the inverter circuit of the later stage is lead to the output terminal OUT via the inverter 33. On the other hand, a PMOS 29 is inserted between a power source and an output point of an inverter circuit consisted of CMOSs 26 and 27. The CMOS 29 is controlled by the pulse of the node NT1.

The clock signal CLK is taken as one input of an NAND gate 24. To the other input, the clock signal is supplied to the inverter 21 and buffers 22 and 23. An output of the NAND gate 24 becomes the pulse of the node NT1 via the inverter 25.

When the clock signal CLK transits from low level to high level, the pulse is generated in the node NT1. A width of this pulse (high level is taken as effective) is defined by a period to propagate the clock signal CLK from a clock input terminal to a note NT2. When the node NT1 is high level, the signal of the input terminal IN is propagated to the output terminal OUT. It should be noted that the logic is reversed. Namely, when the input signal is high, the output signal becomes low. When the input signal is low, the output signal becomes high.

When the node NT1 is low, the node NT3 is fixed at high. A node NT4 becomes so-called dynamic node. Namely, the potential of the node NT4 is held at a value when the node NT1 is high. Namely, when the node NT1 becomes low, the level of the output terminal OUT is maintained.

FIG. 3 is an illustration showing a construction of the latching circuit 3. Like elements to those in FIG. 2 will be represented by like reference numerals. In the shown embodiment, only portions different from FIG. 2 will be discussed. Namely, only circuit construction of a pulse generating portion is different, in which the inverter 25 of FIG. 2 is omitted to take the output of the NAND gate 24 as the node NT1. Other construction is the same as those of FIG. 2.

When the clock signal CLK transit from high level to low level, the pulse is generated at the node NT1. A width of the pulse (high level is taken as effective) is defined by a period propagating the clock signal CLK from the clock input terminal to the node NT2. When the node NT1 is high level, the signal of the input terminal In is propagated to the output terminal OUT. It should be noted that the logic is reversed. Namely, when the input signal is high, the output signal becomes low, and when the input signal is low, the output signal becomes high.

When the node NT1 is low, the node NT3 is fixed high, and the node NT4 becomes so-called dynamic node. Namely, the potential of the node NT4 is held at a value when the node NT1 is high. Namely, when the node NT1 becomes low, the level of the output terminal is maintained.

Now, the minimum value of the input/output delay period required for the logic circuit of the present invention is considered. Namely, a condition that when the clock signal is risen up, the output data of the logic circuit received the input data when the immediately preceding clock signal falls down, can be input to the logic circuit in the next stage, is derived. And a condition that when the clock signal falls down, the output data of the logic circuit receiving the input data upon rising of the immediately preceding clock signal can be input to the logic circuit in the next stage, is derived.

Figure 4:
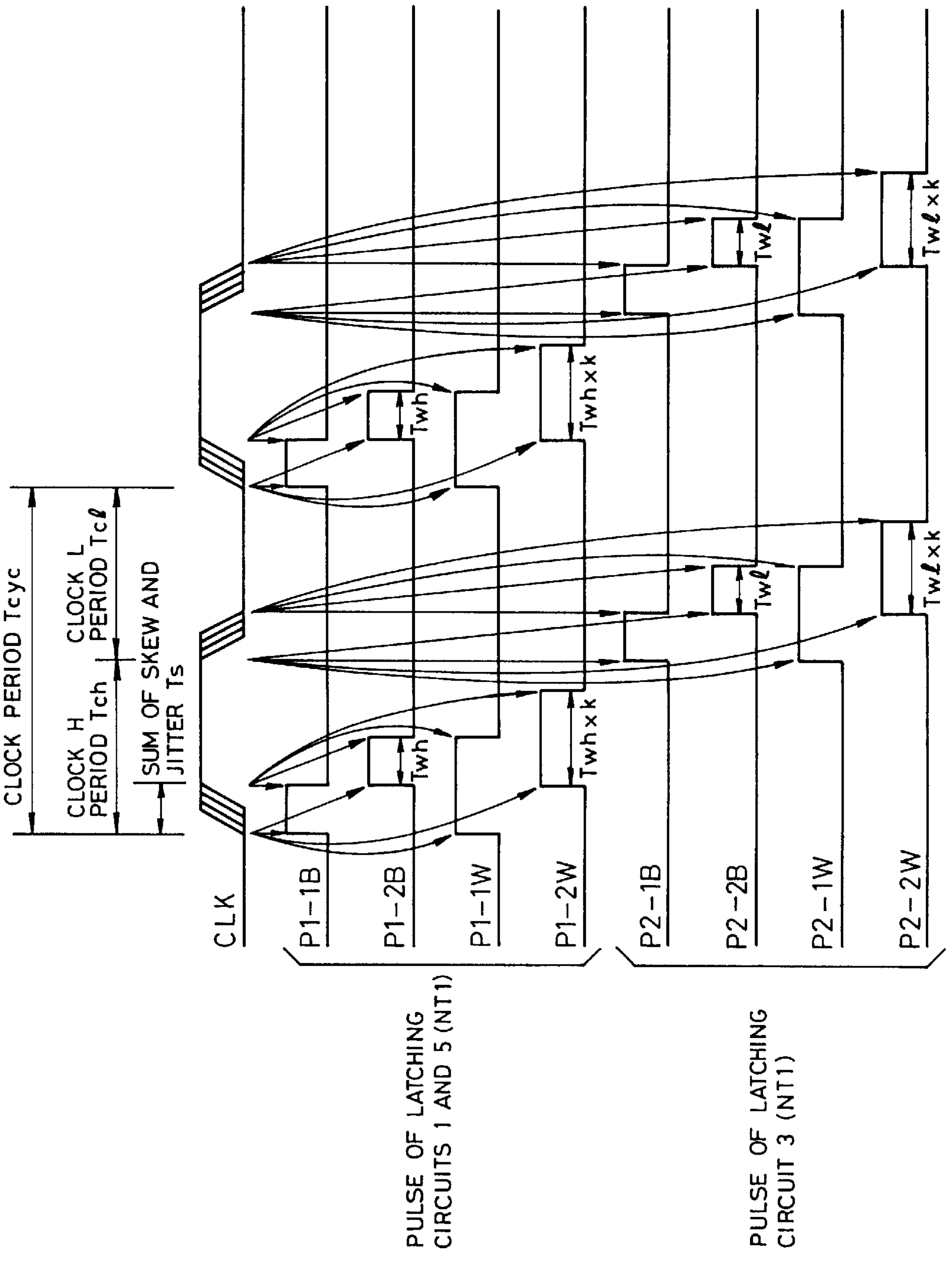
FIG. 4 is a timing chart for explaining operation of the preferred embodiment of the synchronization circuit of the present invention.

Furthermore, in other words, conditions that when the clock signal rises up, the output data of the latching circuit 1 does not pass through two or more logic circuits to be output data for another latch circuit 5 of the same kind at the same timing, and when the clock signal falls down, output data of the latching circuit 3 does not pass two or more logic circuits to be the output data of another latching circuit of the same kind (which is not particularly shown in FIG. 1 and can be the latching circuit to be connected to the logic circuit of the later stage of the latching circuit 5) at the same timing, are derived with reference to a timing chart shown in FIG. 4.

FIG. 4 is the timing chart showing an operation of the shown embodiment. In FIG. 4, the pulses (node NT1) of the latching circuits 1 and 5 are shown as P1-1B, P1-2B, P1-1W and P1-2W, and the pulses (node NT1) of the latching circuit 3 are shown as P2-1B, P2-2B, P2-1W and P2-2W.

P1-1B and P1-1W represent the case where the clock signal rises up at the earliest timing, and P1-2B and P1-2W represent the case where the clock signal rises up at the latest timing. On the other hand, P1-1B and P1-2B represent the case where the clock signal falls down at the earliest timing due to fluctuation of channel length, the gate oxide layer or so forth caused by fluctuation of temperature or so forth during manufacturing of the device or due to fluctuation of power source voltage. On the other hand, P1-1W and P1-2W represent the case where the clock pulse falls down at the latest timing due to fluctuation of channel length, the gate oxide layer or so forth caused by fluctuation of temperature or so forth during manufacturing of the device or due to fluctuation of power source voltage.

Under typical manufacturing condition of LSI or operation temperature range, k in the drawing, namely, a ratio of the maximum value and the minimum value of the pulse width is about 2.

In the latching circuit of the present invention, one kind of the latching circuit corresponding to the latching circuits 1 and 5 and the other kind of the latching circuit corresponding to the latching circuit 3 are used alternately, and the logic circuits are disposed between the latching circuits in cascade connection. When the rising up timing of the pulse of P1-2W is earlier than the falling down timing of the pulses of P2-1B and P2-1W, and the falling down timing of the pulse P2-2W is earlier than the rising up timing of the pulses P2-1B and P1-1W, namely $$Ts+Twh \times k<Tch$$

$$Ts+Twl \times k<Tcl$$

the minimum value of the input/output delay period required for the logic circuit of the present invention can be made zero.

Next, the maximum value of the input/output delay period required for the logic circuit of the present invention is considered. Namely, conditions that when the clock signal rises up, the latching circuit outputs data, the output passes the logic circuit to be the output data of the latching circuit upon falling down of the next clock signal, and when the clock signal falls down, the latching circuit outputs data, the output data passes through the logic circuit to be the output data of the latching circuit when the next clock signal rises up, are derived.

Referring to FIG. 4, when the minimum values Twh and Twl of the pulse width is greater than a sum of the skew of the clock signal and jitter, the maximum value of the input/output delay period required for the logic circuit according to the present invention becomes a value subtracted a delay period $T_{pd}$ from the input terminal IN to the output terminal OUT, from a period Tch where the clock signal held high or a period $T_{cl}$ where the clock signal held low.

Namely, the maximum value of the input/output delay period of the logic circuit of the present invention can set so as to avoid the set up time or the hold time present in the first and second prior arts, and thus only delay period $T_{pd}$ can be a factor to make the maximum value small. Since the maximum value of the input/output delay period of the logic circuit can be set large, complex of circuits can be constructed with one logic circuit. By this, as viewed from the overall synchronization circuit, number of stages of the latching circuit can be reduced. Therefore, it becomes possible to reduce a power for distributing the clock signal. On the other hand, a delay period (latency) from input to output of the synchronization circuit can be made small.

On the other hand, even when the minimum value of the input/output delay period required for the logic circuit is set to zero, operation can be performed irrespective of fluctuation of dispersing condition of device, namely fluctuation of the channel length, the oxide layer or the like, and fluctuation of temperature and power source. On the other hand, due to increasing of LSI elements and increasing of the area, malfunction of the LSI due to timing error of the clock signal supplied to individual latching circuit in the LSI, namely due to clock skew, can be presented.

For example, as fabricated in a typical 0.35 $\mu$m CMOS process, the delay period $T_{pd}$ of the latching circuit is 100 ps, the clock signal skew is 150 ps, jitter is 150 ps, k (representative of ratio of fluctuation in fluctuation of the device and fluctuation of operation temperature and so forth, and an integer greater than one) of FIG. 4 is about two.

For permitting the minimum value of the input/output delay period of the logic circuit to be set zero, it is required to set the pulse width to satisfy:

$$Ts<Twh<(Tch-Ts)/k$$

$$Ts<Twl<(Tcl-Ts)/k$$

Now, assuming Tch and Tcl are 1 ns (1 GHz), by replacing with the foregoing value, $$300<Twh \text{ or } Twl<350$$

is established. Therefore, by setting the pulse width at 325 ps, for example, the synchronization circuit according to the present invention can operate without being influenced by fluctuation of the device, variation of the operation temperature or so forth, clock skew or jitter. Furthermore, at this time, since the minimum value of the input/output delay period of the logic circuit is zero, it is not necessary to wastefully insert the delay element in the logic circuit.

On the other hand, since the maximum value of the input/output delay period of the logic circuit is 900 ps, a cycle period of most clock signal can be used effectively without wasting. Thus, complicated logic circuits can be constructed.

Figure 5:
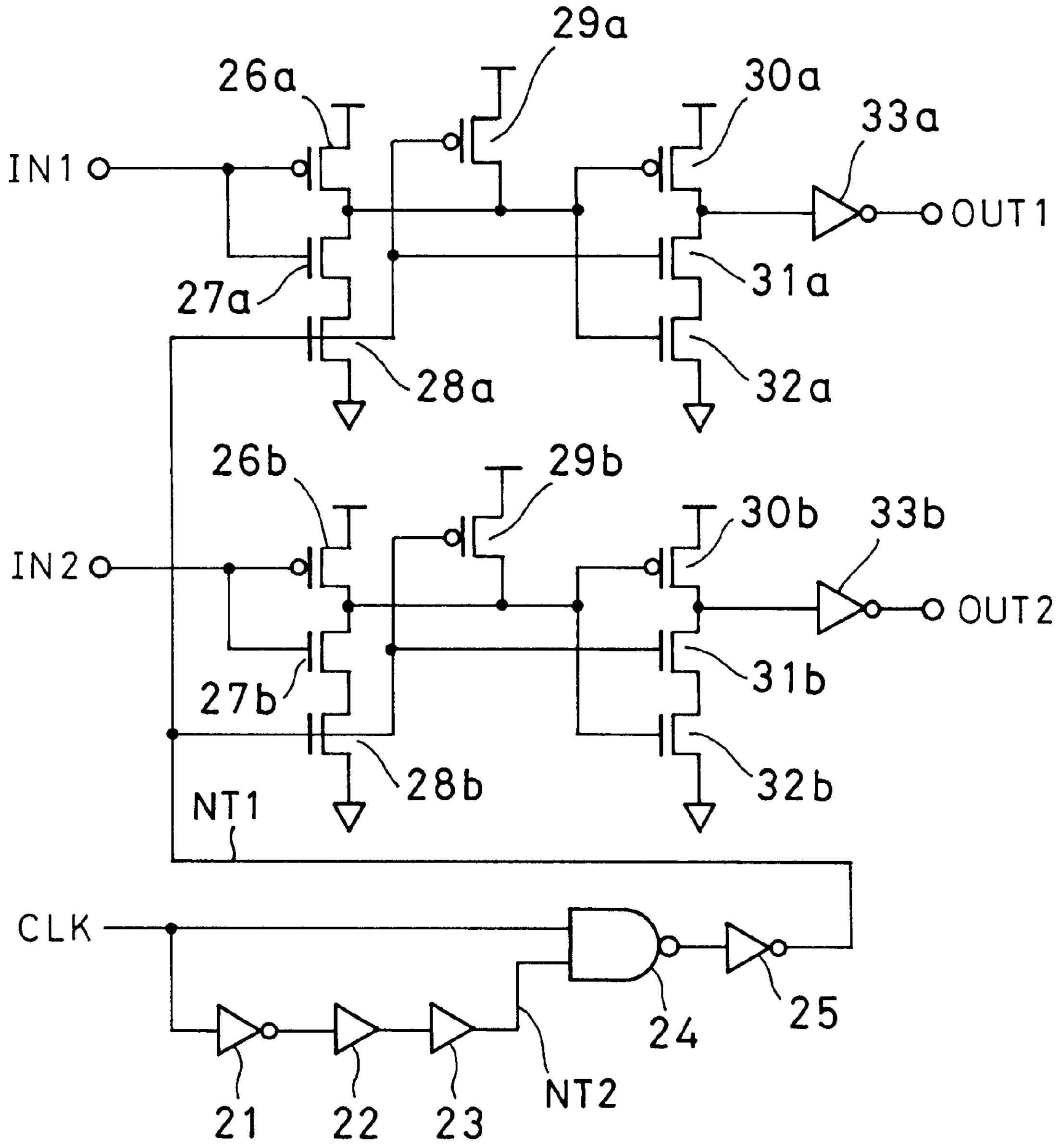
FIG. 5 is an illustration showing another embodiment of latching circuits 1 and 5 of the preferred embodiment of the synchronization circuit shown in FIG. 1.

FIG. 5 is an illustration of another particular embodiment of the latching circuits 1 and 5 of FIG. 1. In FIG. 5, like elements to those in FIG. 2 will be represented by like reference numerals and redundant discussion for such common elements will be omitted in order to keep the disclosure simple enough to facilitate clear understanding of the present invention. In FIG. 5, a plurality of the latching function portion of FIG. 2 are connected in parallel (in FIG. 5, only two latching function portions are provided in parallel, and respective latching function portions are identified by suffix a and b) and one pulse generating portion (pulse at the node NT1) is provided in common.

Figure 6:
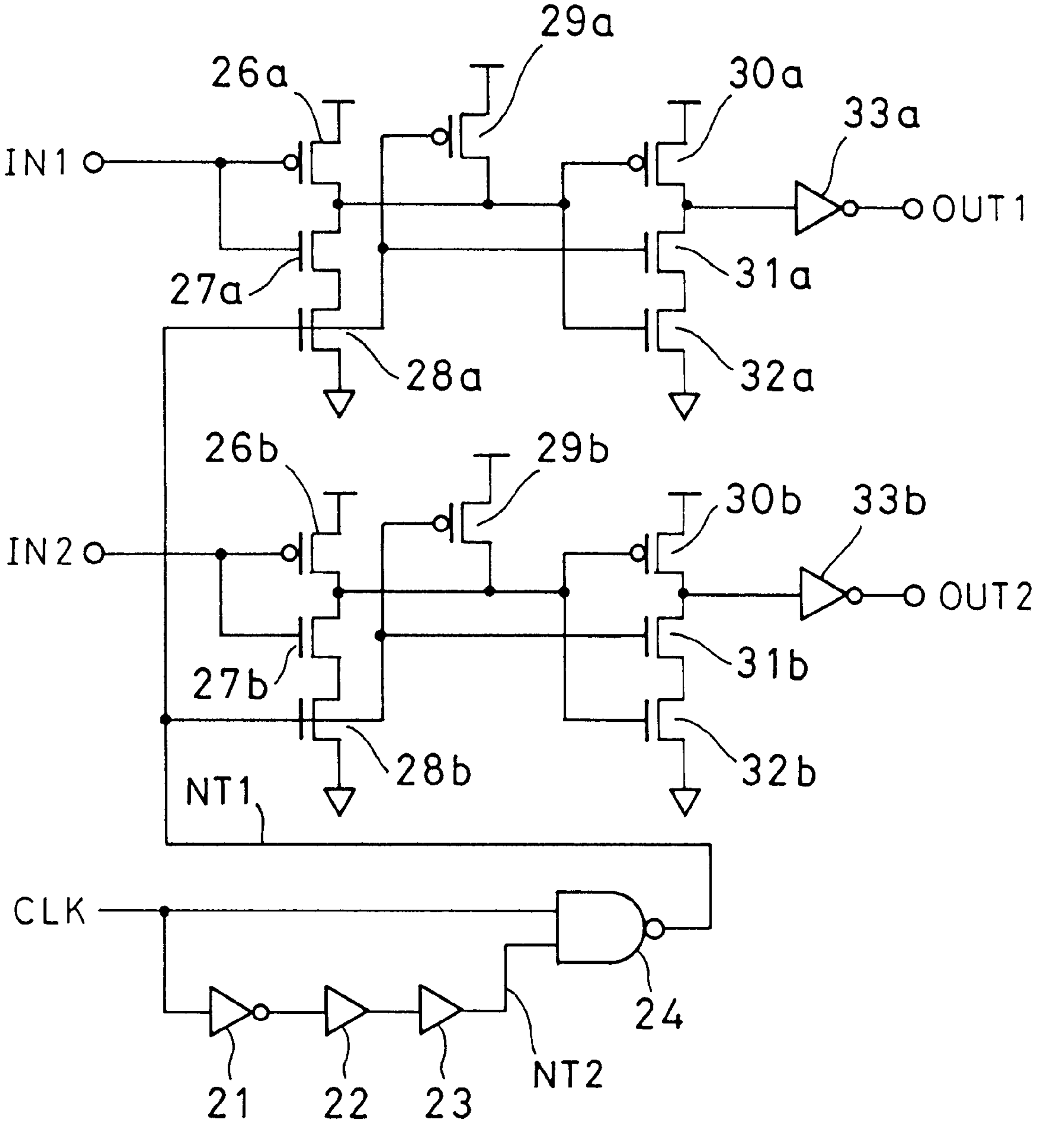
FIG. 6 is an illustration showing another embodiment of latching circuit 3 of the preferred embodiment of the synchronization circuit shown in FIG. 1.
Figure 7:
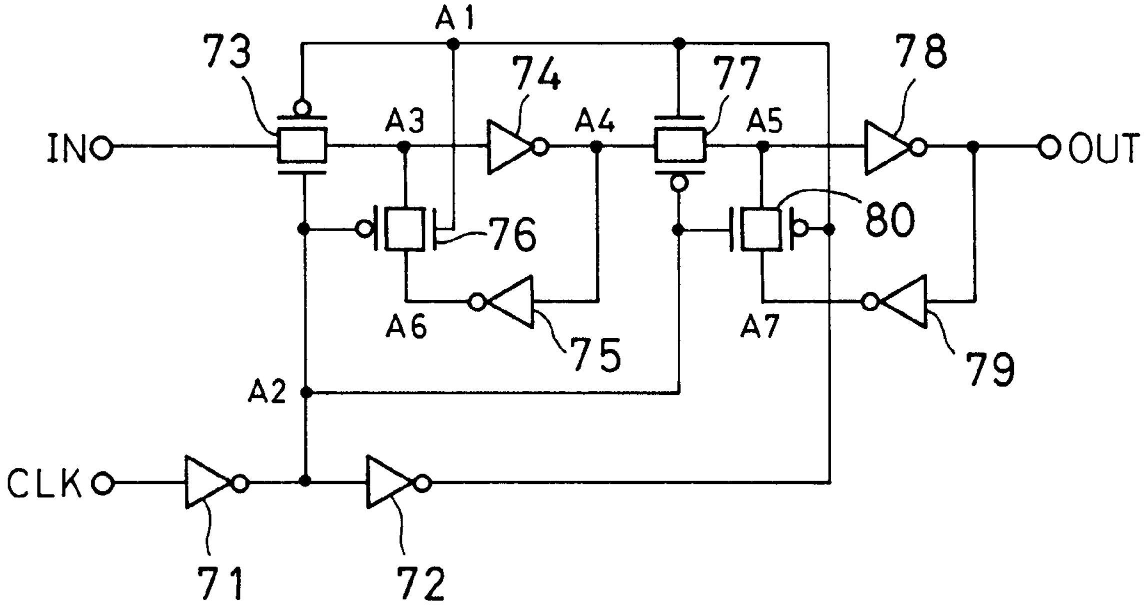
FIG. 7 is an illustration showing one example of the prior art.
Figure 8:
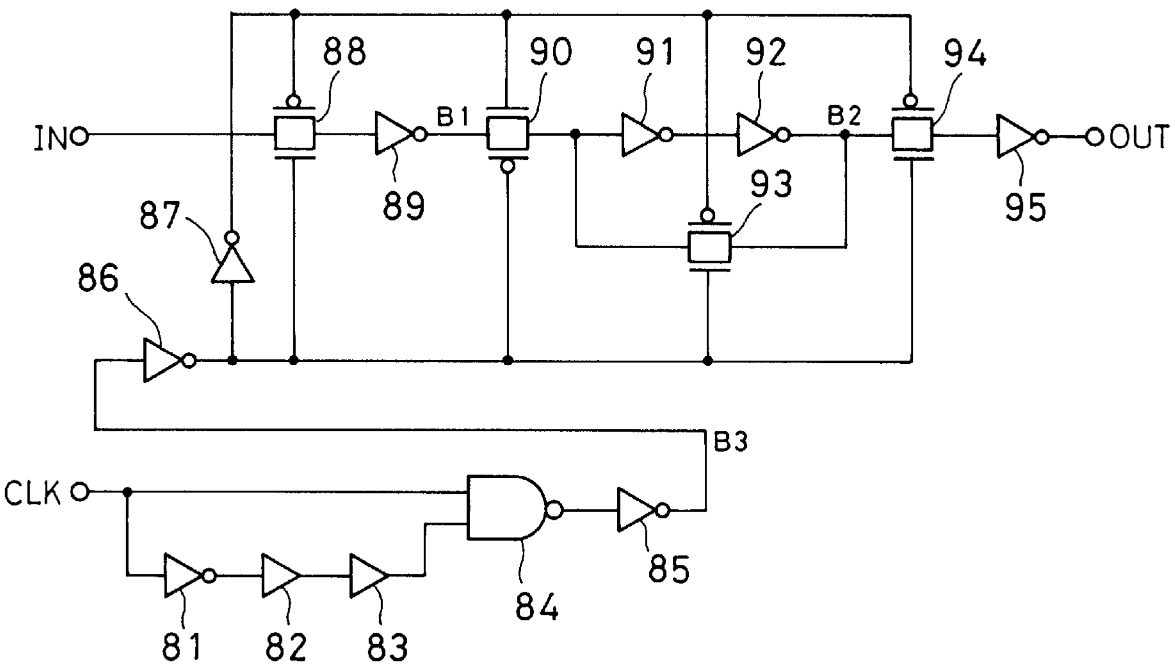
FIG. 8 is an illustration showing another example of the prior art.
Figure 9:
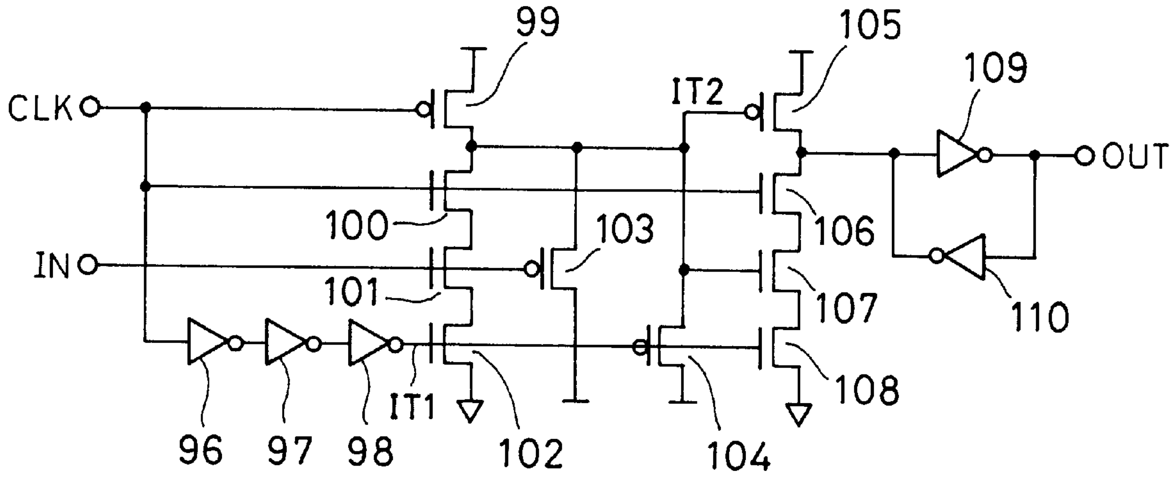
FIG. 9 is an illustration showing a further example of the prior art.

FIG. 6 is an illustration of another particular embodiment of the latching circuit 3 of FIG. 1. In FIG. 6, like elements to those in FIG. 3 will be represented by like reference numerals and redundant discussion for such common elements will be omitted in order to keep the disclosure simple enough to facilitate clear understanding of the present invention. In FIG. 6, a plurality of the latching function portion of FIG. 3 are connected in parallel (in FIG. 6, only two latching function portions are provided in parallel, and respective latching function portions are identified by suffix a and b) and one pulse generating portion (pulse at the node NT1) is provided in common.

By employing the construction of FIGS. 5 and 6 in the latching circuit corresponding to FIG. 1, a register construction simultaneously latching a plurality (a plurality bits) of parallel signals to avoid increasing of the area of the pulse generating portion.

As set forth above, according to the present invention, it becomes possible to provide the synchronization circuit operating in synchronism with the clock signal with avoiding influence of skew or jitter or so forth of the clock signal. On the other hand, it becomes possible to provide the synchronization circuit which can avoid influence of fluctuation of the channel length or the gate oxide layer due to fluctuation of the temperature or so forth during manufacturing of the device, and further fluctuation of temperature during operation or fluctuation of the power source voltage.

Furthermore, in the register controlling flow of data by the clock signal, it becomes possible to make the maximum value of the input/output delay period of the logic circuit to be inserted between the registers as large as possible.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A synchronization circuit comprising:

a first latching circuit having an input terminal, an output terminal and a clock terminal, transferring an input signal from said input terminal to said output terminal for a predetermined period in response to a level transition timing of one direction of a clock signal input to said clock terminal, and maintaining a signal condition of said output terminal in the remaining period;

a second latching circuit having an input terminal, an output terminal and a clock terminal, transferring an input signal from said input terminal to said output terminal for a predetermined period in response to a level transition timing of the other direction of said clock signal input to said clock terminal, and maintaining a signal condition of said output terminal in the remaining period; and a logic circuit connected between said first and second latching circuit, a common clock signal being supplied to said clock terminals of said first and second latching circuits;

wherein assuming a period of a first level of said clock signal being Tch, a period of a second level being Tcl, and a period of sum of a skew and a jitter of said clock signal being Ts, in said first latching circuit, a minimum value of a period for transferring said input signal of said input terminal being said output terminal being Twh and a maximum value being k×Twh (k is an actual number greater than one), in said second latching circuit, a maximum value of a period for transferring said input signal of said input terminal to said output terminal being Twl and a maximum value being k×Twl, setting satisfying $$Ts<Twh<(Tch-Ts)/k$$

$$Ts<Twl<(Tch-Ts)/k$$

being established.

2. A synchronization circuit as set forth in claim 1, wherein said first latching circuit comprises:

a pulse generating portion generating a pulse signal which becomes effective only in said predetermined period in response to a level transition timing in said one direction of said clock signal;

a latching portion transferring said input signal of said input terminal to said output terminal during a period where said pulse signal is effective and maintaining the state of said output signal during remaining period.

3. A synchronization circuit as set forth in claim 2, wherein said second latching circuit comprises:

a pulse generating portion generating a pulse signal which becomes effective only in said predetermined period in response to a level transition timing in said the other direction of said clock signal;

a latching portion transferring said input signal of said input terminal to said output terminal during a period where said pulse signal is effective and maintaining the state of said output signal during remaining period.

4. A synchronization circuit as set forth in claim 3, wherein a plurality of latching portions are provided and said pulse generating portion is provided in common to said plurality of latching portions.

5. A synchronization circuit comprising:

a first latching circuit having an input terminal, an output terminal and a clock terminal, transferring an input signal from said input terminal to said output terminal for a predetermined period in response to a level transition timing of one direction of a clock signal input to said clock terminal, and maintaining a signal condition of said output terminal in the remaining period;

a second latching circuit having an input terminal, an output terminal and a clock terminal, transferring an input signal from said input terminal to said output terminal for a predetermined period in response to a level transition timing of the other direction of said clock signal input to said clock terminal, and maintaining a signal condition of said output terminal in the remaining period;

a first logic circuit connected between said first and second latching circuit;

a third latching circuit having the same construction as said first latching circuit; and a second logic circuit connected between said second latching circuit and said third latching circuit, a common clock signal being supplied to said clock terminals of said first to third latching circuits.

6. A synchronization circuit as set forth in claim 5, wherein assuming a period of a first level of said clock signal being Tch, a period of a second level being Tcl, and a period of sum of a skew and a jitter of said clock signal being Ts, in each of said first and third latching circuits, a minimum value of a period for transferring said input signal of said input terminal being said output terminal being Twh and a maximum value being k×Twh (k is an actual number greater than one), in said second latching circuit, a maximum value of a period for transferring said input signal of said input terminal to said output terminal being Twl and a maximum value being k×Twl, setting satisfying $$Ts<Twh<(Tch-Ts)/k$$

$$Ts<Twl<(Tch-Ts)/k$$

being established.

7. A synchronization circuit as set forth in claim 6, wherein each of said first and third latching circuits comprises:

a pulse generating portion generating a pulse signal which becomes effective only in said predetermined period in response to a level transition timing in said one direction of said clock signal;

a latching portion transferring said input signal of said input terminal to said output terminal during a period where said pulse signal is effective and maintaining the state of said output signal during remaining period.

8. A synchronization circuit as set forth in claim 6, wherein said second latching circuit comprises:

a pulse generating portion generating a pulse signal which becomes effective only in said predetermined period in response to a level transition timing in said the other direction of said clock signal;

a latching portion transferring said input signal of said input terminal to said output terminal during a period where said pulse signal is effective and maintaining the state of said output signal during remaining period.

9. A synchronization circuit as set forth in claim 8, wherein a plurality of latching portions are provided and said pulse generating portion is provided in common to said plurality of latching portions.

* * * * *